US006426250B1

(12) United States Patent
Lee et al.

(10) Patent No.: US 6,426,250 B1
(45) Date of Patent: Jul. 30, 2002

(54) HIGH DENSITY STACKED MIM CAPACITOR STRUCTURE

(75) Inventors: Tzyh-Cheang Lee, Hsin-Chu; Shyh-Chyi Wong, Taichung; Chih-Hsien Lin, Hsin-Chu; Chi-Feng Huang, Ping-Tung Hsien, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/863,225

(22) Filed: May 24, 2001

(51) Int. Cl.[7] .......................................... H01L 21/8242
(52) U.S. Cl. ...................... 438/239; 438/244; 438/253; 438/700; 438/957
(58) Field of Search ........................... 438/3, 239, 244, 438/253, 700, 737, 957; 257/296, 301, 532, 535

(56) References Cited

U.S. PATENT DOCUMENTS

| | | | |
|---|---|---|---|
| 5,386,131 A | * 1/1995 | Sato | 257/296 |
| 5,879,985 A | 3/1999 | Gambino et al. | 438/253 |
| 6,100,155 A | 8/2000 | Hu | 438/386 |
| 6,117,725 A | 9/2000 | Huang | 438/241 |
| 6,136,640 A | 10/2000 | Marty et al. | 438/239 |
| 6,150,183 A | 11/2000 | Fukuda et al. | 438/3 |
| 6,150,214 A | * 11/2000 | Kaeriyama | 257/295 |
| 6,168,984 B1 | * 1/2001 | Yoo et al. | 438/239 |
| 6,258,729 B1 | * 7/2001 | DeBoer et al. | 438/640 |
| 6,281,023 B2 | * 8/2001 | Eastep et al. | 257/295 |

* cited by examiner

Primary Examiner—David Nelms
Assistant Examiner—Dao H Nguyen
(74) Attorney, Agent, or Firm—George O. Saile; Stephen B. Ackerman

(57) ABSTRACT

A first metal plug is formed in the first layer of dielectric. A freestanding second metal plug is created that aligns with and makes contact with the first metal plug, extending the first metal plug. The second metal plug is surrounded by an opening that has been created in layers of etch stop and dielectric. A layer of capacitor dielectric is deposited over the exposed surfaces of the first and second metal plugs and the inside surfaces of the opening that surrounds the second plug. A layer of metal is created over the capacitor dielectric inside the opening in the layers of etch stop and dielectric.

17 Claims, 4 Drawing Sheets

HIGH DENSITY STACKED MIM CAPACITOR STRUCTURE

BACKGROUND OF THE INVENTION (1) Field of the Invention

The invention relates to the fabrication of integrated circuit devices, and more particularly, to a method and structure for the creation of a Metal-to-Metal capacitor that provides increased capacitive values.

(2) Description of the Prior Art

Functions that are performed by semiconductor devices can generally be divided into functions of data manipulation or logic functions and functions of data storage. Functions of data manipulation are mostly related to digital data manipulation but can also comprise functions of analog data manipulation. Functions of data storage provide data retention capabilities that are performed by semiconductor memory devices. Two types of memory devices can be identified, that is memory functions that retain data in storage cells from which the data can only be read (Read Only Memories or ROM's) and memory functions whereby the data cannot only be read but can also be altered (Random Access Memories or RAM's).

The latter category of memory devices has been created using a number of different approaches, resulting in different types of RAM devices. Distinguished can be for instance the Dynamic RAM (DRAM), which uses capacitors as the storage medium and which are therefore, due to the non-permanent nature of the capacitive storage, periodically refreshed, and the Static RAM (SRAM) which depends on the presence of a power source for the retention of the stored data. DRAM memories offer advantages of economy of construction and of relatively high storage capabilities and have therefore attracted most of the attention in the semiconductor industry.

For the creation of analog integrated circuit devices and data retention or memory devices, capacitors are critical components. Capacitors can be divided in a number of different types of capacitors, dependent on and reflecting types of construction of the capacitor and the materials that are used in the construction of the capacitors. For instance, Metal Oxide Metal (MOM) capacitors are well known in the art and can be created at multiple levels in a semiconductor device and in contact with via openings. Other types of capacitors are referred to as, based on the materials that are used for the electrodes of the capacitors, polysilicon-silicon, polysilicon-polysilicon or metal-metal capacitors.

Is it required that the capacitor of a semiconductor device has a high storage retention, is further impervious to noise and does not require an excessive amount of surface area. To address these concerns, different constructs have been proposed for the creation of the capacitor of a DRAM cell. One such arrangement provides a stacked capacitor, which can be created as part of a DRAM cell. Another arrangement of a memory cell comprises a so-called cylindrical stacked type capacitor. With the stacked capacitor and the cylindrical capacitor, word lines and bit lines are provided to address and read out the level of voltage (data) that is stored in the capacitor.

Metal-metal capacitors are capacitors which have metal as the material of choice for the two electrodes of the capacitor, the metal of the two electrodes being separated by a dielectric. Metal-metal capacitors offer the advantage of providing a relatively constant value of capacitance over a relatively wide range of voltages that is applied to the plates of the capacitor. In addition, metal-metal capacitors have a relatively small parasitic resistance, reducing parasitic looses incurred by the metal-to-metal capacitor.

The creation of metal-to-metal capacitors is frequently and advantageously integrated with processing steps that are aimed at creating levels of interconnect metal in a semiconductor device. It is well known in the art that device miniaturization makes use of creating overlying layers of metal that are separated by layers of dielectric or insulation. The overlying layers of metal are patterned to form networks of interconnect lines, overlying patterns of interconnect lines are connected by creating openings or vias in the interposed layers of dielectric, these openings in turn are filled with a metal. For purposes of electrical performance, the thickness of the layer of dielectric that is interposed between adjacent and overlying layers of metal is limited to about 1 $\mu$m. In integrating the creation of a metal-to-metal capacitor with other processing steps of creating interconnect metal, the problem arises of creating adequate spacing between the plates of the capacitor since a typical thickness of the dielectric layer that is used for a metal-to-metal capacitor is about 200 Angstrom. For this and other reasons, the typical processing sequence that is used for the creation of metal-to-metal capacitors is to first create a supporting level of dielectric over which a lower level of metal is created for the bottom plate of the capacitor. This lower level of dielectric may be surrounded by a protective barrier layer. The metal that is deposited for the lower electrode of the capacitor is polished, a first dielectric layer is deposited over the surface of the polished lower layer of metal in combination with forming interconnect lines on this level of metal. An opening that aligns with the lower electrode of the capacitor is etched in the first layer of dielectric. This first dielectric is removed from above the lower electrode of the capacitor after which a thin second layer of dielectric is deposited, filling the opening to form the dielectric of the capacitor. This second layer of dielectric (for the dielectric of the capacitor) is typically deposited to a thickness of between about 50 and 500 Angstrom. A third layer of dielectric is deposited over the second layer of dielectric, by creating an opening in this third layer of dielectric that aligns with the lower electrode of the capacitor, and by filling this opening with a metal, the second electrode of the capacitor is created. This creation of the second electrode of the capacitor can be combined with creating a network of interconnect lines that overlies the third layer of dielectric.

The latter highlighted process of creating a capacitor has a number of disadvantages. One of the main disadvantages of this process is that it allows only for the creation of planar capacitors, which are limited to a relatively low value of capacitance and therefore to a relatively low value of voltage storage capability. Also, for purposes of creating a capacitor, it is of importance to create a separating layer of dielectric between the two plates of the capacitor that has a uniform thickness. This requirement is difficult to meet for the creation of a planar capacitor because deposition thickness of the second, relatively thin layer of dielectric is difficult to control, especially so where silicon dioxide is used as a dielectric material of the capacitor in addition to using a barrier layer of titanium nitride (which is a frequently used barrier layer material) since titanium nitride chemically interacts with the silicon dioxide, compromising the integrity of the dielectric of the capacitor. Furthermore, the planar capacitor that is created in this manner extends over two levels of metallization of the semiconductor device while, in order to achieve a capacitance value of significance, the capacitor requires a relatively large surface area, which is undesirable in the era of sub-micron devices and device feature sizes.

The invention provides a method that allows for the creation of a stacked capacitor that provides a relatively large capacitive value over a relatively small surface area.

U.S. Pat. No. 6,100,155 (Hu) shows a MOM capacitor process.

U.S. Pat. No. 6,1509,183 (Fukuda et al.), U.S. Pat. No. 6,136,640 (Marty et al.) and U.S. Pat. No. 6,117,725 (Huang) show related capacitor patents.

U.S. Pat. No. 5,879,985 (Bambino et al.) shows a damascene process for a crown capacitor.

SUMMARY OF THE INVENTION

A principle objective of the invention is to provide a method for the creation of a stacked capacitor whereby a relatively large capacitive value can be realized over a relatively small semiconductor surface area.

In accordance with the objectives of the invention a new method is provided for the creation of a metal-to-metal capacitor on a semiconductor surface. A first layer of dielectric is deposited over a semiconductor surface, a first opening is created in the first layer of dielectric and filled with a planarized first layer of metal, forming a first metal plug in the first layer of dielectric. A first etch stop layer followed by a second layer of dielectric is deposited over the surface of the first layer of dielectric, including the surface of the first metal plug formed in the first layer of dielectric. The first etch stop layers and the second layer of dielectric are patterned, creating a second opening through these layers that aligns with the first metal plug formed in the first layer of dielectric. The second opening is filled with a planarized second layer of metal, creating a second metal plug that aligns and makes contact with the first metal plug, extending the first metal plug. The patterned layer of first etch stop and second layer of dielectric are removed from the surface of the first layer of dielectric, completing the creation of a first electrode of the capacitor. The first electrode comprises the first metal plug and the second metal plug. A second etch stop layer followed by a third layer of dielectric is deposited over the surface of the first layer of dielectric, including the surface of the first electrode of the capacitor. The second etch stop layer and the third layer of dielectric are etched, creating a third opening in the layers of second etch stop and third layer of dielectric that aligns with and surrounds the first electrode of the capacitor. A layer of capacitor dielectric is deposited over the surface of the third layer of dielectric, including inside surfaces of the third opening, including exposed surfaces of the first electrode of the capacitor. A third layer of metal is deposited over the layer of capacitor dielectric, the third layer of metal is polished down to the surface of the layer of capacitive dielectric.

DESCRIPTION OF THE PREFERRED EMBODIMENTS

Figure 1:
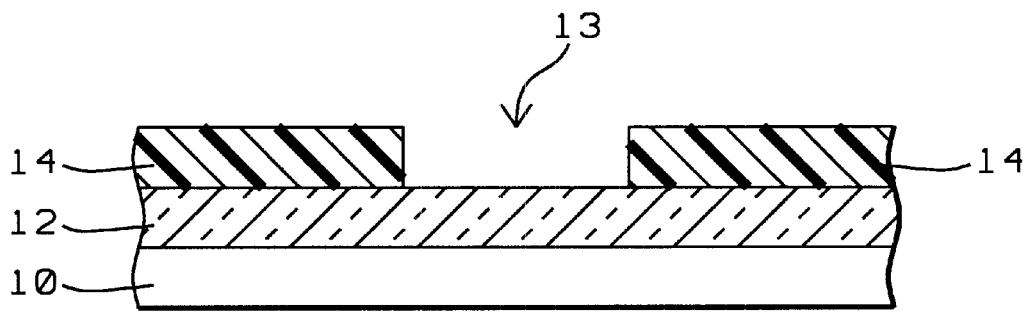
FIG. 1 shows a cross section of a semiconductor surface with a first layer of dielectric and a patterned first layer of photoresist deposited on the surface thereof.

Referring now specifically to FIG. 1, there is shown a cross section of a semiconductor surface 10, typically the surface of a monocrystalline silicon substrate, on the surface of which has been uniformly deposited a first layer 12 of dielectric.

The most commonly used dielectrics in the art and therefore the preferred dielectrics that can be used for layer 12 without being limited to these dielectrics are silicon dioxide (doped or undoped), silicon oxynitride, parylene or polyimide, spin-on-glass, plasma oxide or LPCVD oxide. The preferred dielectric material to be used for the invention is silicon oxide ($SiO_2$).

Layer 12 of dielectric, preferably comprising silicon oxide, can be formed using monosilane ($SiH_4$) and nitrous oxide ($N_2O$) as a source material or using a reactant gas mixture such as dichlorosilane ($SiCl_2H_2$) and $O_2$ deposited by applying LPCVD or PECVD procedures, at a pressure between about 200 mTorr and 800 mTorr, at a temperature between about 600 and 800 degrees C.

Parameters of thickness for the various layers that are created by the invention will not be highlighted since these parameters are highly dependent on and essentially determined by the design and physical measurements of the capacitor that is provided by the invention.

Layer 14 of photoresist can be patterned and etched using conventional methods of photolithography and etch.

Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or insoluble (negative working) and be washed away. In either case, the remaining resist on the surface forms the desired pattern. In the cross section that is shown in FIG. 1, first opening 13 is created in layer 14 of photoresist. Opening 13 partially exposes the surface of the first layer 12 of dielectric.

Figure 2:
FIG. 2 shows a cross section after the first layer of dielectric has been etched in accordance with the pattern of the first layer of photoresist, the first layer of photoresist has been removed from the surface of the first layer of dielectric.

FIG. 2 shows a cross section of the semiconductor surface 10 after the first layer 12 of dielectric has been etched in accordance with the first opening 13 that has been created in the first layer 14 of photoresist. The patterned first layer 14 of photoresist has been removed from the surface of the first layer 12 of dielectric.

Layer 12 of silicon dioxide can be etched via anisotropic Reactive Ion Etch (RIE) using $CHF_3/O_2/Ar/N_2$ or $CH_2F_2/O_2/Ar/N_2$ or $CH_3F/O_2/Ar/N_2$ or $C_4H_8/O_2/Ar/N_2$ as etchants.

Layer 14 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 3:
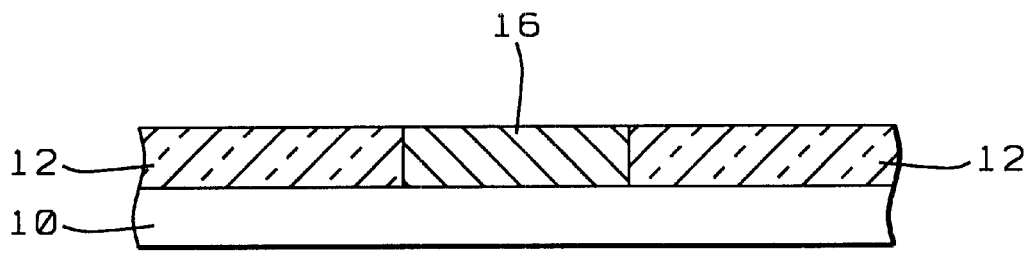
FIG. 3 shows a cross section after the opening that has been created in the first layer of dielectric has been filled with metal, creating a first metal plug.

FIG. 3 shows a cross section of the semiconductor surface after a layer 16 of metal, preferably copper, has been deposited over the surface of the first layer 12 of dielectric and after this layer of metal has been polished. Layer 16 can be deposited using conventional methods of CVD or sputter, the polishing of the surface of layer 16 uses conventional methods of Chemical Mechanical Polishing (CMP). The polish of the deposited layer 16 of metal is considered complete when the surface of the first layer 12 of dielectric has been reached, leaving in place a first metal plug 16 (FIG. 3) that fills opening 13 in the first layer 12 of dielectric.

Figure 4:
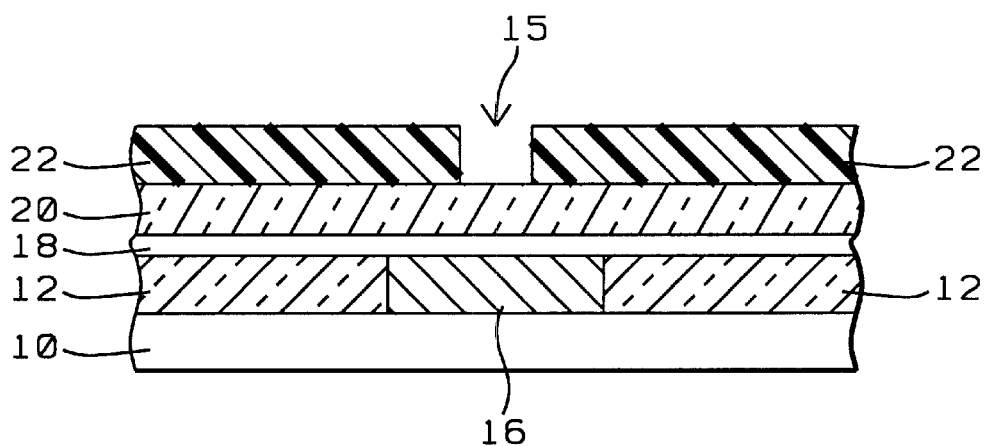
FIG. 4 shows a cross section after successively have been deposited over the surface of the first layer of dielectric a first etch stop layer and a second layer of dielectric. A patterned second layer of photoresist has been created on the surface of the second layer of dielectric.

In the cross section that is shown in FIG. 4, the following layers have successively been deposited:
 layer 18, a first etch stop layer
 layer 20, a second layer of dielectric
 layer 22, a second layer of photoresist.

Materials that are typically used for etch stop layers comprise Spin-On-Glass (SOG) while for instance CVD nitride is a suitable etch stop material when polyimide layers are used. It is preferred that the first etch stop layer 18 comprise a silicon nitride layer. The layer 18 of silicon nitride ($Si_3Ni_4$) can be deposited using LPCVD procedures at a pressure between about 200 mTorr and 400 mTorr, at a temperature between about 600 and 800 degrees C., to a thickness of about 1500 to 3000 Angstrom using $NH_3$ and $SiH_4$ or $SiCl_2H_2$. This layer 18 can also be deposited using PECVD procedures in which case the temperature is limited to about 400 degrees C. or less, PECVD deposition may be required for applications where copper metallization is performed. The silicon nitride layer 18 can also be deposited using LPCVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 300 Angstrom. PECVD procedures may be applied, using these processing conditions, with however the previously indicated temperature limitation (of 400 degrees C. or less) being in effect.

Methods that can be applied for the deposition and the patterning and etching of the second layer 22 of photoresist have previously been highlighted and will therefore not be further discussed at this time. Opening 15 is created in layer 22 of photoresist applying these methods. It must be noted that opening 22 aligns with the first metal plug 16 that has been created in the first layer 12 of dielectric.

Figure 5:
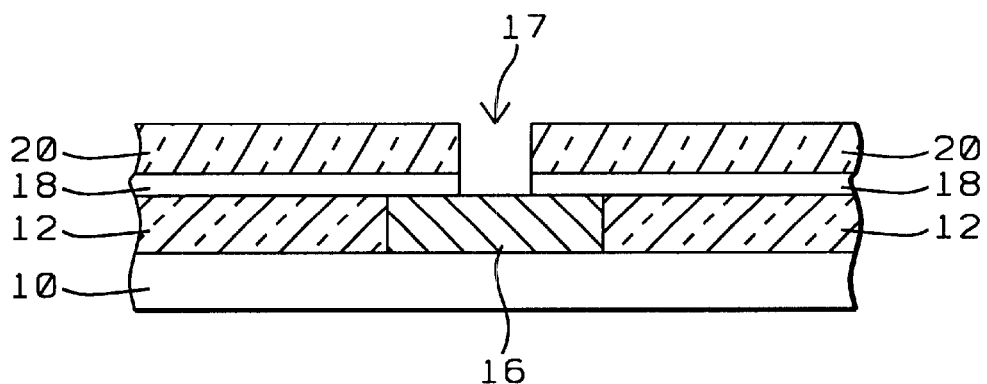
FIG. 5 shows a cross section after the first etch stop layer and the second layer of dielectric have been etched in accordance with the pattern of the second layer of photoresist that has been created on the surface of the second layer of dielectric, the patterned second layer of photoresist has been removed from the surface of the second layer of dielectric.

FIG. 5 shows a cross section wherein layers 20 of dielectric and the etch stop layer 18 have been etched in accordance with opening 15 that has been created in layer 22 of photoresist.

The stop layer 18 of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 18 can also be wet etched using a buffered oxide etchant (BOE). The BOE may comprise a mixed solution of fluoroammonium and fluorohydrogen (7:1) and phosphoric acid solution. The silicon nitride layer 18 can also be etched using anisotropic RIE using $CHF_3$ or $SF_6-O_2$ or $SF_6/HB_8$ as an etchant. The preferred method of removing silicon nitride is an isotropic wet etch process using hot phosphoric acid. The silicon nitride layer 18 can also be dipped into phosphoric acid ($H_3PO_4$) to be removed. The nitride layer can also be removed from the trenches created in the layer of photoresist by dipping the structure into hot phosphoric acid ($H_3PO_4$) (standard wet nitride removal).

After layers 18 of silicon nitride and 20 of dielectric have been etched using the procedures that have been highlighted above, creating opening 17 through these two layers, the patterned layer 22 of photoresist is removed from the surface of the second layer 20 of dielectric using methods of photoresist strip that have been previously highlighted.

Figure 6:
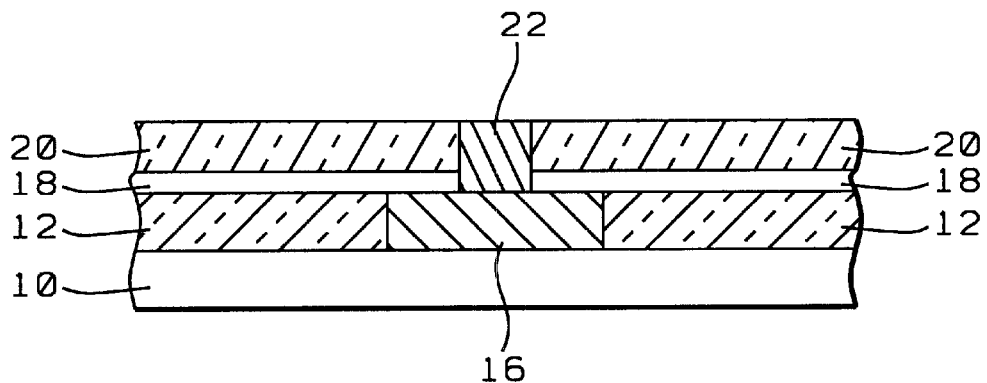
FIG. 6 shows a cross section after the opening that has been created in the second layer of dielectric and the first etch stop layer has been filled with a metal, creating a second plug that aligns with the first plug.

As a next step in the sequence of the invention, opening 17 is filled with a metal, preferably copper, using conventional methods of CVD deposition or sputtering. After the copper has been deposited, the surface of the deposited copper is polished using conventional methods of CMP, the polish of the deposited copper is essentially completed when the surface of the second layer 20 of dielectric has been reached. Metal plug 22, preferably comprising copper, remains in place, this plug is referred to as the second metal plug. The second metal plug 22 aligns with and overlies the first metal plug 16, as shown in cross section in FIG. 6. The aligned and superimposed plugs 16 and 22 form the first electrode of the capacitor.

Figure 7:
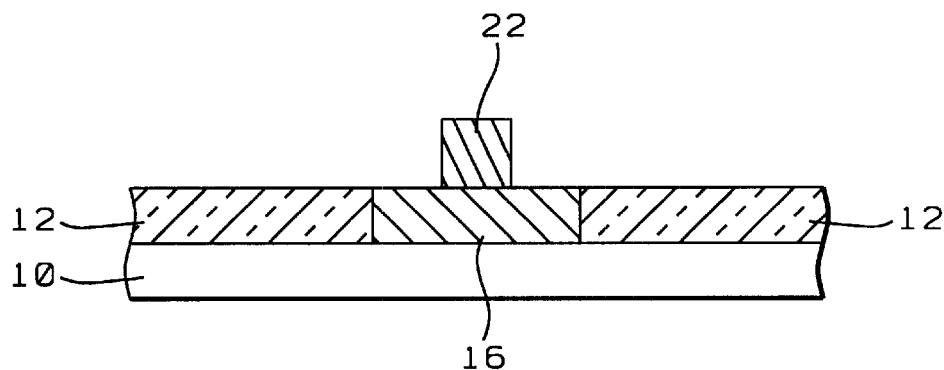
FIG. 7 shows a cross section after the first etch stop layer and the second layer of dielectric have been removed from the surface of the first layer of dielectric, creating a first electrode of a capacitor.

For the next step of the invention, the layers 20 (the second layer of dielectric) and 18 (the first etch stop layer) are removed from the surface of layer 12, the first layer of dielectric, as shown in cross section in FIG. 7. Previously highlighted methods for the etch removal of dielectric and etch stop material can be applied for this processing sequence. The removal of layers 20 and 18 exposed the surface of the first layer 12 of dielectric and partially exposes the surface of the first electrode 16/22 of the capacitor.

Figure 8:
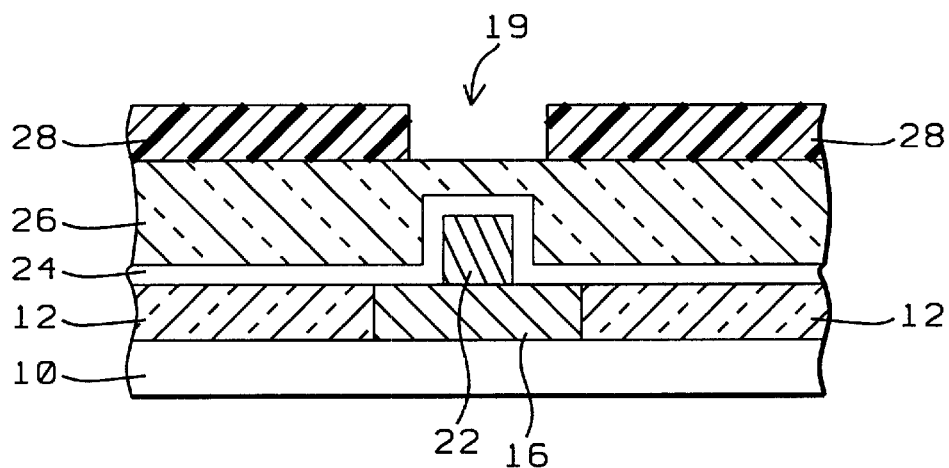
FIG. 8 shows a cross section after a second etch stop layer and a third layer of dielectric have been successively deposited on the surface of the first layer of dielectric, a patterned third layer of photoresist has been created on the surface of the third layer of dielectric.

FIG. 8 shows the completion of the deposition of the following layers:

layer 24, a second etch stop layer, layer 26, a third layer of dielectric, and layer 28, a third layer of photoresist.

Processing conditions for these processing steps have previously been highlighted, opening 19 is created in the third layer 28 of photoresist. Opening 19 aligns with and overlies the first electrode 16/22 of the capacitor.

Figure 9:
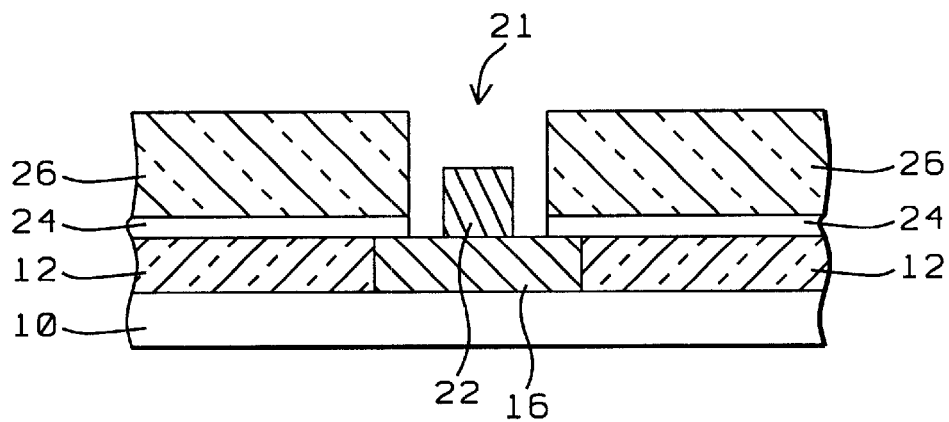
FIG. 9 shows a cross section after the second etch stop layer and the third layer of dielectric have been etched in accordance with the pattern that has been created in the third layer of photoresist.

FIG. 9 shows a cross section after the third layer 26 of dielectric and second etch stop layer 24 have been etched in accordance with opening 19 that has been created in the third layer 28 of photoresist.

Conditions of etch for layers 26 and 24 have previously been highlighted, opening 21 is created in accordance with opening 19 that has been created in layer 28 of photoresist.

Figure 10:
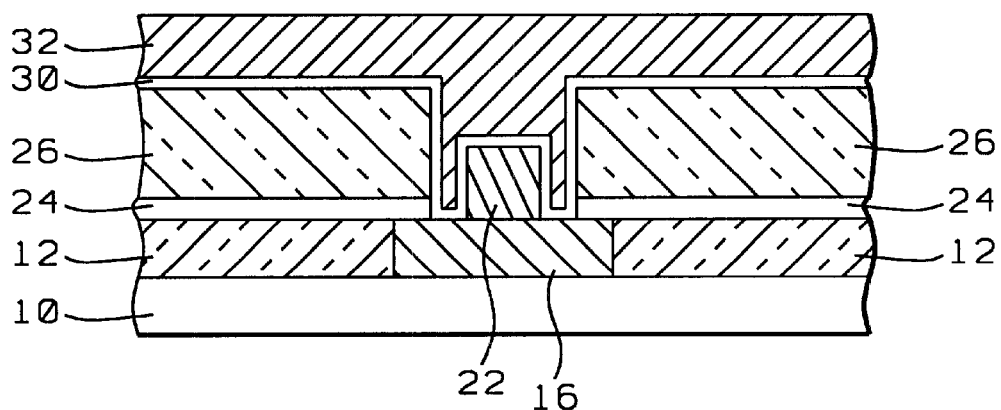
FIG. 10 shows a cross section after a layer of capacitor dielectric have been deposited over the third layer of dielectric, thereby including the inside surfaces of the opening created in the third layer of dielectric and the second etch stop layer, thereby further including the exposed surfaces of the first electrode of the capacitor.

FIG. 10 shows how a layer 30 of capacitor dielectric is conformally deposited over the surface of the third layer 26 of dielectric, thereby including the exposed surfaces of the first electrode 16/22 and the inside surface of opening 21 that has been created through layers 26 and 24. Layer 30 is typically deposited to a thickness between about 200 and 1500 Angstrom. Layer 30 must comprise a high dielectric constant material and may comprise undoped silicate glass (USG) or any other suitable capacitor dielectric and is preferably deposited to a thickness between about 200 and 1500 Angstrom. It is well known in the art that this layer of capacitor dielectric must be deposited as thin as possible and in accordance with considerations of reliability since a thin layer of dielectric is required for a high capacitive value of the capacitor. Other capacitor dielectric materials that can be used for layer 24 are silicon nitride ($Si_3N_4$), oxynitrides, $Ta_2O_5$, and $TiO_2$. Methods of deposition of layer 24 can be methods of rf sputter deposition. Alternatively, barium strontium titanium oxide (BST) can be used, also rf sputter deposited. Considerations of thickness of deposition of layer 24 are closely related to the material that is selected for this layer and the therewith connected dielectric constant of the selected material. For materials with a relatively low dielectric constant, a thicker layer 24 must be deposited in order to create a capacitor dielectric that has a dielectric performance that is equivalent to the performance of a high dielectric constant material. For instance, $Ta_2O_5$ has a known dielectric constant of 21 while BST has a dielectric constant of 50. It is therefore possible to deposit a thicker layer of $Ta_2O_5$ compared with the thickness of a layer of BST and have electrical performance of the $Ta_2O_5$ based capacitor that is equal to a BST based capacitor.

FIG. 10 further shows that a conformal layer 32 of metal, preferably copper, has been deposited over the surface of the capacitor layer 30. Conventional methods of CVD or sputter deposition are used for this deposition of layer 32.

Figure 11:
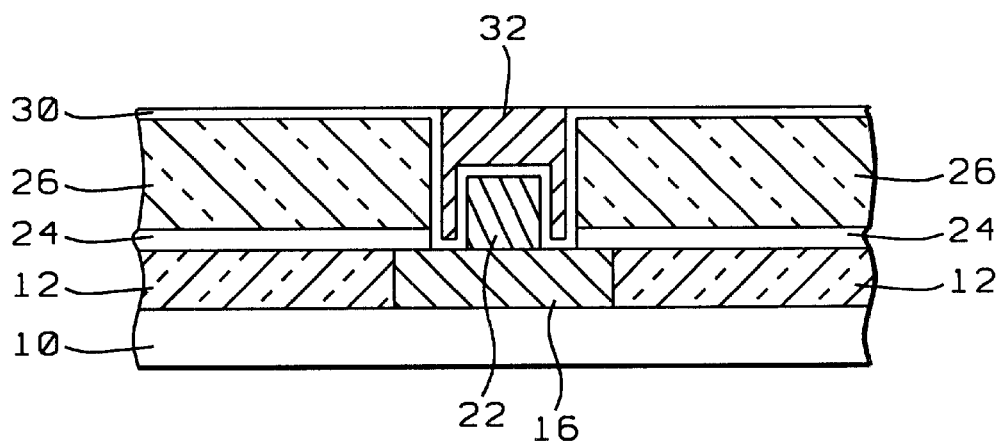
FIG. 11 shows a cross section after a planarized layer of metal has been deposited over the surface of the layer of capacitor dielectric, creating a second electrode of a capacitor.

As a final processing step, the layer 32 of deposited metal is polished, FIG. 11, a process that is continued until the surface of the layer 30 of capacitor dielectric is reached. At this point and in accordance with the cross section that is shown in FIG. 11, a stacked capacitor has been created with as first electrode member 16/22, as dielectric the capacitor dielectric layer 30 and as second electrode the conductive plug 32.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a stacked metal-to-metal capacitor, comprising the steps of:

providing a semiconductor substrate;

forming a first metal electrode of said stacked metal-to-metal capacitor, said first metal electrode comprising a first and second metal plugs, by depositing a first layer of dielectric over the surface of said substrate, creating a first opening in said first layer of dielectric, filling said first opening with a planarized first layer of metal, creating said first metal plug having a first surface area in said first layer of dielectric, further creating a free standing second metal plug having a second surface area and having a height, said second metal plug comprising a second layer of metal being in contact with said first metal plug while overlying and being centered with respect to said first metal plug, said second surface area being smaller than said first surface area by a measurable amount;

forming an opening for a second metal electrode of said stacked metal-to-metal capacitor by successively depositing a second etch stop layer and a third layer of dielectric over exposed surfaces of said first and second metal plugs, including exposed surfaces of said first layer of dielectric, by patterning and etching said third layer of dielectric and said second etch stop layer down to the surface of said first layer of dielectric, thereby creating a third opening having a third surface area in said second etch stop layer and said third layer of dielectric, said third opening aligning with and surrounding said first electrode of said metal-to-metal capacitor, said third surface area being smaller than said first surface area and larger than said second surface area by a measurable amount, said third surface area being above and-removed from said second surface area by a measurable amount;

forming a capacitor dielectric by depositing a layer of capacitor dielectric over inside surfaces of said opening for a second metal electrode, including exposed surfaces of said first and second metal plugs, further including exposed surfaces of said third layer of dielectric; and creating a second metal electrode by depositing a third layer of metal over the surface of said layer of capacitor dielectric, thereby filling said opening for a second metal electrode, by further polishing said deposited third layer of metal down to the surface of said layer of capacitor dielectric, the surface of said polished third layer of metal being in a plane with the surface of said layer of capacitor dielectric where said layer of capacitor dielectric overlays said third layer of dielectric.

2. The method of claim 1 wherein said semiconductor substrate has been provided with semiconductor device structures such as gate electrodes and source and drain regions.

3. The method of claim 1 wherein said semiconductor substrate has been provided with semiconductor device structures such as gate electrodes and source and drain regions and multiple levels of interconnect lines.

4. The method of claim 1 wherein said capacitor dielectric is selected from the group consisting of Undoped Silicate Glass (USG) and silicon nitride ($Si_3N_4$) and oxynitrides and Strontium Titanium Oxide (BST) and $Ta_2O_5$ and $TiO_2$ and is preferably deposited to a thickness between about 200 and 1500 Angstrom.

5. The method of claim 1 wherein said capacitor dielectric comprises a dielectric having a high value of dielectric constant.

6. The method of claim 1 wherein said metal of said first metal electrode and said second metal electrode comprises copper.

7. The method of claim 1 wherein said metal of said first metal electrode and said second metal electrode comprises AlCu.

8. The method of claim 1 wherein said patterning and etching said first layer of dielectric creating a first opening in said first layer of dielectric comprises the steps of:

depositing a first layer of photoresist over the surface of said first layer of dielectric;

patterning and etching said first layer of photoresist, creating a first opening in-said layer of photoresist having a surface area equal to the surface area of said first metal plug;

etching said first layer of dielectric in accordance with said opening created in said first layer of photoresist; and removing said patterned and etched first layer of photoresist from the surface of said first layer of dielectric.

9. The method of claim 1 wherein said creating a free standing second metal plug comprises the steps of:

depositing a first etch stop layer over the surface of said first layer of dielectric, including the surface of said first metal plug;

depositing a second layer of dielectric over the surface of said first etch stop layer;

depositing a second layer of photoresist over the surface of said second layer of dielectric;

patterning and etching said second layer of photoresist, creating a second opening in said second layer of photoresist that has a surface area that equals said surface area of said second metal plug;

etching said second layer of dielectric and said first etch stop layer in accordance with said second opening created in said second layer of photoresist, creating a second opening in said second layer of dielectric and said first etch stop layer;

removing said patterned and etched second layer of photoresist from the surface of said second layer of dielectric;

depositing a second layer of metal over the surface of said second layer of dielectric, thereby filling said second opening created in said second layer of dielectric and said first etch stop layer with said second layer of metal;

polishing the surface of said second layer of metal down to the surface of said second layer of dielectric; and removing said etched second layer of dielectric and said first etch stop layer from the surface of said first layer of dielectric.

10. The method of claim 1 wherein said forming an opening for a second metal electrode of said stacked metal-to-metal capacitor comprises the steps of:

depositing a second etch stop layer having a thickness over exposed surfaces of said first metal plug and said second metal plug of said first electrode of said metal-to-metal capacitor, including exposed surfaces of said first layer of dielectric;

depositing said third layer of dielectric over the surface of said second etch stop layer, said third layer of dielectric having a thickness such that the combined thickness of said second etch stop layer and said third layer of dielectric exceeds said height of said second plug by a measurable amount;

depositing a third layer of photoresist over the surface of said third layer of dielectric;

patterning and etching said third layer of photoresist, creating a third opening having a third surface area in said third layer of photoresist, said third opening aligns with and is centered with respect to said second plug, whereby said third surface area is smaller than said first surface area of said first plug and larger than said second surface area of said second plug by a measurable amount; and etching said third layer of dielectric and said second etch stop layer in accordance with said third opening created in said third layer of photoresist, said third opening penetrating said third layer of dielectric and said second etch stop layer, creating a third opening in said third layer of dielectric and said second etch stop layer that is aligned with and surrounds said second plug of said first electrode of said metal-to-metal capacitor.

11. A method for creating a stacked metal-to-metal capacitor, comprising the steps of:

providing a semiconductor substrate;

depositing a first layer of dielectric over the surface of said substrate;

patterning and etching said first layer of dielectric creating a first opening having a first surface area in said first layer of dielectric;

depositing a first layer of metal over the surface of said first layer of dielectric, including said first opening having been created in said first layer of dielectric;

polishing the surface of said first layer of metal down to the surface of said first layer of dielectric, creating a first metal plug having a surface area that equals said first surface area of said first opening created in said first layer of dielectric;

depositing a first etch stop layer over the surface of said first layer of dielectric, including the surface of said first metal plug;

depositing a second layer of dielectric over the surface of said first etch stop layer;

depositing a second layer of photoresist over the surface of said second layer of dielectric;

patterning and etching said second layer of photoresist, creating a second opening in said second layer of photoresist having a second surface area that is smaller than said first surface area by a measurable amount, said second opening being centered with respect to said first metal plug created in said first layer of dielectric;

etching said second layer of dielectric and said first layer of etch stop layer in accordance with said second opening created in said second layer of photoresist, creating a second opening in said first layer of etch stop and said second layer of dielectric, said second opening penetrating through said second layer of dielectric and said first layer of etch stop layer, partially exposing the surface of said first metal plug;

removing said second layer of photoresist from the surface of said second layer of dielectric;

depositing a second layer of metal over the surface of said second layer of dielectric, including the second opening created in said first layer of etch stop and said second layer of dielectric;

polishing the surface of said second layer of metal down to the surface of said second layer of dielectric;

removing said first etch stop layer and said second layer of dielectric from the surface of said first layer of dielectric, creating a free standing second metal plug having a surface area that equals said second surface area of said opening created in said second layer of photoresist, said free standing second metal plug being centered with respect to the first metal plug;

depositing a second etch stop layer over exposed surfaces of said first and second metal plug, including the exposed surface of said first layer of dielectric;

depositing a third layer of dielectric over the surface of said second etch stop layer;

depositing a third layer of photoresist over the surface of said third layer of dielectric;

patterning and etching said third layer of photoresist, creating a third opening having a third surface area in said third layer of photoresist, said third opening being centered with respect to said second metal plug, said third surface area of said third opening being smaller than said first surface area and larger than said second surface area by a measurable amount;

etching said third layer of dielectric and said second etch stop layer in accordance with said third opening created in said third layer of photoresist, creating a third opening in said third layer of dielectric and said second layer of etch stop, said third opening penetrating through said third layer of dielectric and said second layer of etch stop layer, partially exposing the surface of said first and second metal plug;

removing said patterned and etched third layer of photoresist from the surface of said third layer of dielectric;

depositing a layer of capacitor dielectric over the surface of said third layer of dielectric, thereby including inside surfaces of said third opening created in said third layer of dielectric and said second etch stop layer, further including exposed surfaces of said first and second metal plug;

depositing a third layer of metal over the surface of said layer of capacitor dielectric; and polishing the surface of said third layer of metal down to the surface of said layer of capacitor dielectric.

12. The method of claim 11 wherein said semiconductor substrate has been provided with semiconductor device structures such as gate electrodes and source and drain regions.

13. The method of claim 11 wherein said semiconductor substrate has been provided with semiconductor device structures such as gate electrodes and source and drain regions and multiple levels of interconnect lines.

14. The method of claim 11 wherein said capacitor dielectric is selected from the group comprising Undoped Silicate Glass (USG) and silicon nitride ($Si_3N_4$) and oxynitrides and Strontium Titanium Oxide (BST) and $Ta_2O_5$ and $TiO_2$ and is preferably deposited to a thickness between about 200 and 1500 Angstrom.

15. The method of claim 11 wherein said capacitor dielectric comprises a dielectric having a high value of dielectric constant.

16. The method of claim 11 wherein said metal of said first metal electrode and said second metal electrode comprises copper.

17. The method of claim 11 wherein said metal of said first metal electrode and said second metal electrode comprises AlCu.

* * * * *